United States Patent
Marhefka

(10) Patent No.: US 7,479,940 B2
(45) Date of Patent: Jan. 20, 2009

(54) DISPLAY DEVICE WITH ELECTRICAL ZIPPER INTERCONNECT

(75) Inventor: Duane W. Marhefka, Copley, OH (US)

(73) Assignee: Kent Displays Incorporated, Kent, OH (US)

( * ) Notice: Subject to any disclaimer, the term of this patent is extended or adjusted under 35 U.S.C. 154(b) by 612 days.

(21) Appl. No.: 11/273,454

(22) Filed: Nov. 14, 2005

(65) Prior Publication Data

US 2006/0103641 A1    May 18, 2006

Related U.S. Application Data

(60) Provisional application No. 60/627,579, filed on Nov. 12, 2004.

(51) Int. Cl.
*G09G 3/36* (2006.01)

(52) U.S. Cl. .......................................... 345/87; 345/84

(58) Field of Classification Search .................... 345/87, 345/84, 3.1
See application file for complete search history.

(56) References Cited

U.S. PATENT DOCUMENTS

| | | | |
|---|---|---|---|
| 1,219,881 A | 3/1917 | Sundback | |
| 2,002,306 A | 5/1935 | Berlin et al. | |
| 2,084,499 A | 6/1937 | Newman | |
| 3,622,936 A | 11/1971 | Negishi | |
| 3,680,950 A | 8/1972 | Haas et al. | |
| 3,753,201 A | 8/1973 | Ohman | |
| 3,962,729 A | 6/1976 | Cook | |
| 4,042,854 A | 8/1977 | Luo et al. | |
| 4,062,626 A | 12/1977 | Kawakami et al. | |
| 4,404,555 A | 9/1983 | Long et al. | |
| 4,717,244 A | 1/1988 | Hilsum et al. | |
| 4,896,946 A | 1/1990 | Suzuki et al. | |
| 4,931,021 A | 6/1990 | Mohan | |
| 4,948,232 A | 8/1990 | Lange | |
| 4,981,336 A | 1/1991 | Mohan | |

(Continued)

FOREIGN PATENT DOCUMENTS

WO   2005/072447   8/2005

(Continued)

OTHER PUBLICATIONS

International Search Report (PCT/US2005/41310) dated Jul. 16, 2007.

(Continued)

*Primary Examiner*—Richard Hjerpe
*Assistant Examiner*—Shaheda A Abdin
(74) *Attorney, Agent, or Firm*—Pearne & Gordon LLP

(57) ABSTRACT

A display device includes an electronic display adapted to produce images, an electronic device that electrically communicates with the display and a zipper interconnect adapted to enable electrical connection between the display and the electronic device. The electronic display can be a reflective display such as a liquid crystal display or an emissive display such as one containing light emitting diodes. The electronic device that communicates with the display can be drive electronics adapted to electrically address the display so as to produce the images. In particular, the display is a cholesteric liquid crystal display that can be bistable and in the form of a passive matrix, active matrix or direct drive display.

46 Claims, 5 Drawing Sheets

U.S. PATENT DOCUMENTS

| | | |
|---|---|---|
| 5,200,845 A | 4/1993 | Crooker et al. |
| 5,453,863 A | 9/1995 | West et al. |
| 5,499,927 A | 3/1996 | Ohno et al. |
| 5,625,477 A | 4/1997 | Wu et al. |
| 5,636,044 A | 6/1997 | Yuan et al. |
| 5,644,330 A | 7/1997 | Catchpole et al. |
| 5,748,277 A | 5/1998 | Huang et al. |
| 5,751,257 A | 5/1998 | Sutherland |
| 6,034,752 A | 3/2000 | Khan et al. |
| 6,133,895 A | 10/2000 | Huang |
| 6,320,563 B1 | 11/2001 | Yang et al. |
| 6,377,321 B1 | 4/2002 | Khan et al. |
| 6,381,482 B1 | 4/2002 | Jayaraman et al. |
| 6,483,563 B2 | 11/2002 | Khan et al. |
| 6,532,052 B1 | 3/2003 | Khan et al. |
| 6,654,080 B1 | 11/2003 | Khan et al. |
| 6,712,420 B1 | 3/2004 | Kargilis et al. |
| 6,805,568 B2 | 10/2004 | Kuzmenka |
| 6,819,310 B2 | 11/2004 | Huang et al. |
| 6,850,217 B2 | 2/2005 | Huang et al. |
| 7,009,666 B2 | 3/2006 | Khan et al. |
| 2002/0084901 A1 | 7/2002 | Mantyjarvi et al. |
| 2003/0169221 A1 | 9/2003 | Stephenson et al. |
| 2003/0202136 A1 | 10/2003 | Stephenson et al. |
| 2004/0032545 A1 | 2/2004 | Stephenson et al. |
| 2004/0224138 A1 | 11/2004 | Farrell et al. |
| 2005/0001797 A1 | 1/2005 | Miller, IV et al. |
| 2005/0083284 A1 | 4/2005 | Huang et al. |
| 2005/0162606 A1 | 7/2005 | Doane et al. |
| 2005/0195354 A1 | 9/2005 | Doane et al. |

FOREIGN PATENT DOCUMENTS

| | | |
|---|---|---|
| WO | 2005/072455 | 8/2005 |
| WO | 2005/081779 | 9/2005 |

OTHER PUBLICATIONS

Barnes, Kevin N.: "Zipper Connectors for Flexible Electronic Circuits," Langley Research Center, Hampton, Virginia, Sep. 2001.

Luo, F.C.: "Active matrix LC Displays", Liquid Crystals—Applications and Uses, vol. 1, pp. 397-436, Sep. 1990.

Doane, J. William: "Polymer dispersed liquid crystal displays", Liquid Crystals—Applications and Uses, vol. 1, pp. 361-395, Sep. 1990.

Doane, J. William et al.: "Cholesteric liquid crystals for flexible displays", Flexible Flat Panel Displays, pp. 331-354, Jun. 2005.

Vogels, Joost P.A. et al.: "Robust flexible LCDs with paintable technology", SID Symposium Digest of Technical Papers, vol. 35, Issue 1, pp. 767-769, May 2004.

Jenkins, L.C. et al.: "Functional testing of TFT/LCD arrays", IBM J. Res. Develop., vol. 36, No. 1, Jan. 1992.

Peng, Du-Zen et al.: "An ultra-thin polycrystalline-silicon thin-film transistor with SiGe raised source-drain", ESSDERC 2002, pp. 535-537.

Sarma, K.R. et al.: "Active matrix OLED using 150° C a-Si TFT backplane built on flexible plastic substrate", SPIE Proc. vol. 5080, Cockpit Displays vol. X (2003), pp. 180-191.

van de Biggelaar, Ton et al.: "Passive and active matrix addressed polymer light emitting diode displays", Proc. SPIE vol. 4295, pp. 134-146, Apr. 2001.

DISPLAY DEVICE WITH ELECTRICAL ZIPPER INTERCONNECT

I. FIELD OF THE INVENTION

The present invention features flexible electronic display devices and, in particular, electrical interconnects used in such devices.

II. BACKGROUND OF THE INVENTION

Today, there is a world wide effort to develop displays that are flexible and rugged so they can conform to three-dimensional configurations and also be repeatedly flexed. Displays are being developed that possess the flexibility of a thin plastic sheet, paper or fabric, so that they can be draped, rolled up or folded like paper or cloth. This not only makes the display more portable and easier to carry, but expands its potential applications well beyond those of typical flat panel information displays: a display worn on the sleeve; the back of a bicyclists coat that shows changing direction signals; textile that changes its color or design, are but a few examples.

While the ability of an electrically addressable liquid crystal display to be flexible and deform like cloth or paper would be advantageous for any display technology, it is especially advantageous in the case of bistable reflective display technologies such as cholesteric liquid crystal displays. Cholesteric displays can be made very reflective such that they can be seen in bright daylight or in a dimly lit room without the aid of a backlight. They can be made to be bistable to conserve power even further so that they require power only when it is desired to refresh the image. Cholesteric liquid crystalline materials are unique in their optical and electro-optical features. Of principal significance, they can be tailored to Bragg reflect light at a pre-selected wavelength and bandwidth. This feature comes about because these materials posses a helical structure in which the liquid crystal (LC) director twists around a helical axis. The distance over which the director rotates 360 degrees is referred to as the pitch and is denoted by P. The reflection band of a cholesteric liquid crystal is centered at the wavelength, $\lambda_O=0.5(n_e+n_o)P$ and has the bandwidth, $\Delta\lambda=(n_e-n_o)P$ which is usually about 100 nm where $n_e$ and $n_o$ are the extra-ordinary and ordinary refractive indices of the LC, respectively. The reflected light is circularly polarized with the same handedness as the helical structure of the LC. If the incident light is not polarized, it will be decomposed into two circularly polarized portions with opposite handedness and one of the portions reflected. The cholesteric material can be electrically switched to either one of two stable textures, planar or focal conic, or to a homeotropically aligned state if a suitably high electric field is maintained. In the planar texture the helical axis is oriented perpendicular to the substrate to Bragg reflect light in a selected wavelength band whereas in the focal conic texture it is oriented, on the average, parallel to the substrate so that the material is transparent to all wavelengths except for weak light scattering that is negligible on an adjacent dark background. These bistable structures can be electronically switched between each other at rapid rates on the order of milliseconds. Gray scale is also available in that only a portion of a pixel can be switched to the reflective state thereby controlling the reflective intensity.

The bistable cholesteric reflective display technology is ideal for displays on cloth or fabric that can be body worn as the bistability feature avoids the need for refreshing power and high reflectivity avoids the need for power-consuming backlights. These combined features can extend battery lifetimes from hours to months over displays that do not have these features. Reflective displays are also easily read in very bright sunlight where backlit displays are ineffective. Because of the high reflective brightness of a cholesteric display and its exceptional contrast, a cholesteric display can be easily read in a dimly lit room. The wide view angle offered by a cholesteric display allows several persons to see the display image at the same time from different positions. Cholesteric displays have several important electronic drive features that other bistable reflective technologies do not. Of extreme importance for addressing a matrix display of many pixels is the characteristic of a voltage threshold. A threshold voltage is essential for multiplexing a row/column matrix without the need of an expensive active matrix (transistor at each pixel). Bistability with a voltage threshold allows very high-resolution displays to be produced with low-cost passive matrix technology.

In addition to bistable cholesteric displays with liquid crystalline materials having a positive dielectric anisotropy, it is possible to fabricate a cholesteric display with liquid crystalline materials having a negative dielectric anisotropy as, for example, described in the U.S. Pat. No. 3,680,950 to Haas et al. or Pat. No. 5,200,845 to Crooker et al., incorporated herein by reference. These "negative materials," like "positive" materials, are chiral nematic liquid crystals that are prepared from nematic materials that have been twisted into a helical molecular arrangement by the addition of a chiral compound or collection of chiral compounds. The negative and positive materials are prepared from nematic liquid crystals with either a negative or positive dielectric anisotropy respectively.

Negative type cholesteric displays can operate in a bistable mode where the material is switched into the stable planar (e.g., color reflective) texture with an AC pulse or into the stable focal conic (e.g., transparent) texture with a DC pulse as described by U.S. Pat. No. 3,680,950. There are other modes of operation such as has been disclosed by Crooker where a droplet dispersion of negative cholesteric materials is switched into the planar, color reflective texture with an applied electric field, but relaxes back into a transparent texture when the field is removed.

Some cholesteric materials possess a dielectric anisotropy that can be negative under an applied electric field of one frequency but positive at another frequency. This feature can be used to drive a bistable display using a dual frequency drive scheme as described in U.S. Pat. No. 6,320,563.

Another important feature of cholesteric materials is that the layers reflecting red, green, and blue (RGB) colors as well as IR night vision can be stacked (layered) on top of each other without optically interfering with each other. This makes maximum use of the display surface for reflection and hence brightness. This feature is not held by traditional displays where the display is broken into pixels of different colors and only one third of the incident light is reflected. Using all available light is important for observing a reflective display in a dimly lit room without a backlight or frontlight. Gray scale capability allows stacked RGB, high-resolution displays with full-color capability where as many as 4096 colors have been demonstrated. Because a cholesteric display cell does not require polarizers, low cost birefringent plastic substrates such as PET can be used. Other features, such as wide viewing-angles and wide operating temperature ranges as well as fast response times make the cholesteric bistable reflective technology, the technology of choice for many low power applications.

Cholesteric liquid crystal displays on flexible plastic substrates have been reported by Minolta Co. Ltd. and by the present assignee, Kent Displays, Inc., involving two plastic substrates filled with cholesteric liquid crystal materials (Society for Information Display Proceedings, 1998, pp 897-900 and 51-54 respectively). While the substrates are flexible the assembled displays are much less flexible because of the lamination of two substrates together. Kent Displays Inc. has also found that greater flexibility can be achieved if only one substrate is used and the display materials are coated, printed on the substrate or on a release liner for transfer to a flexible substrate as disclosed in Patent Application No.: PCT/US2005/003144, entitled "Liquid Crystal Display Films," filed Jan. 28, 2005, which is incorporated herein by reference in its entirety.

Cholesteric liquid crystals are made suitable for standard coating and printing techniques by use of polymer droplet dispersions. As droplet dispersions, the materials are made insensitive to pressure and shear such that an image on a bistable cholesteric display is not readily erased by flexing the substrate. Recently Stephenson et al. at Kodak fabricated flexible bistable reflective displays with polymer dispersions of cholesteric liquid crystals on a single transparent plastic substrate using photographic methods (U.S. Patent Application Publications: US 2003/0202136 A1 and US 2004/0032545 A1). This process involves a sequence of depositions on transparent polyester plastic whereby the end product is a display where the images are viewed through the substrate. Such a process requires substrate materials that are transparent such as a clear plastic sheet.

More recently, bistable cholesteric displays have been disclosed by the present assignee, Kent Displays, Inc., that do not require a transparent substrate, making available a broader range of substrate materials such as fabrics made of fibers that can be deformed not only by bending or being rolled up, but also being draped or folded as disclosed in U.S. application Ser. No. 11/006,100, filed Dec. 7, 2004, which is incorporated herein by reference in its entirety. These added features offer many advantages and open up new display applications. This brings to the marketplace a display that has the physical deformability of fabric so that it can be an integral part of clothing and have the feel and appearance of cloth in that it can be draped and has folds. Being electrically addressable these liquid crystal displays have the physical deformability or drapability of textile or cloth, which brings advantages in manufacturing where the display including the electrodes is made of organic materials and are coated or printed on the substrate. Conducting polymers are used instead of the traditional inorganic materials such as indium tin oxide, ITO, for the electrodes. On some fabrics, preparation layers are used to color, smooth or planarize the surface, adjust the resistivity, index match and other features. Polymer dispersions of cholesteric liquid crystals can be made from a wide variety of different methods as is suitable for various manufacturing processes or display function. This is a substantial advance in addressable liquid crystal displays wherein, by forming the displays on or integrally with a drapable substrate, the display itself is drapable. Such substrates include textiles or fabrics made of natural or man-made fibers such as cloth or paper, as well as non-fibrous materials such as flexible or even drapable polymeric sheets or films. The substrate need not be transparent. With deformable substrates, cholesteric or other liquid crystal displays are made flexible, rugged and can even be sewn into or onto clothing to provide a wearable display. In fact, the display itself can form the material used to make the clothing or other fabric construct. A display with the drapability of cloth provides a new dimension to the display technology enabling display applications that were not possible before such as conforming to three-dimensional structures or flexing and folding with the garment containing the display. To this end, the displays are operatively deformable, meaning that they will function even though they are or have been deformed. In preferred applications, the displays are operatively drapable such that they can have folds and possess a measurable drape coefficient. The formability of a fabric can be defined as its ability to re-form from a two-dimensional shape to a simple or complex three-dimensional shape.

A key difficulty with these new fabric substrates is the means of connecting the displays to their drive electronics, both electrically and mechanically. Displays on rigid (glass) or flexible (plastic) substrates are typically electrically connected to their drive electronics using flex connectors, conductive elastomer or metal pins. Mechanical attachment is provided to the printed circuit board holding the drive electronics by a bezel or adhesion. These mechanical and electrical connection approaches are all undesirable for a flexible display because they require rigidity to be added to the display at the point of connection. What is required is a means to secure the display in place and to provide electrical contacts without compromising the flexibility. Additionally, it must be possible to make and remove the connections both quickly and easily.

This invention features a new interconnect that provides electrical connection of flexible displays and electrical components connected thereto to the associated electronics. The interconnect of the present invention extends the basic concept of a zipper that has been used for years to quickly and easily mechanically connect pieces of fabric, into the new application of flexible liquid crystal displays.

III. DISCLOSURE OF THE INVENTION

The invention features an electronic display device where electrical connections are made to the associated electronics through a zipper. The device is attached and unattached to the associated electronics by zipping or unzipping the zipper. The display device is a cholesteric reflective display, a display that includes other liquid crystal materials, or other electronic display device known in the art. The display may include a flexible substrate such as fabric material. The electrical connections may be made to orthogonal lines of row electrodes and column electrodes that form a passive matrix display. Alternatively, the electrical connections are made to the electrodes of an active matrix driven display. Also, the electrical connections may be made to the leads of a direct driven display. Multiple displays may be interconnected by the zipper method.

The inventive zipper provides electrical, in addition to mechanical, connection between two flexible substrates in a flexible electrical display device. The flexible substrate may be composed of textile fabricated from natural or synthetic fibers, polymeric sheet, paper, flexible glass, flexible metal and combinations thereof. Although the following disclosure of the invention refers to fabric substrates and fabric displays, it should be appreciated that the substrate is not limited to fabrics and may be formed of another flexible substrate material such as those listed above. The zipper is like a traditional clothing zipper with the additional feature that adjacent teeth (or groups of teeth) on one side of the zipper are alternately electrically conducting and electrically insulating. These teeth align with like teeth on the opposing side of the zipper, such that multiple electrical connections are formed across the zipper interconnect. The individual connections are isolated from each other by the insulating teeth or insulating portions of the conductive teeth. Conductors, such as conductive traces composed of conducting polymer, carbon nanotubes, or metal connect the conducting teeth on each side of the zipper to the appropriate electrical circuit on the flexible substrate.

In a first embodiment of the inventive flexible display device with zipper interconnect, the display includes a plurality of electrical display conductors. Drive electronics are adapted to electrically address the display conductors effective to produce images on the display. A flexible substrate is selected from the group consisting of a textile fabricated from natural or synthetic fibers, a sheet of polymeric material, paper, flexible metal, flexible glass and combinations thereof. The flexible substrate includes a first substrate portion and a second substrate portion. The display is supported by the first substrate portion and the drive electronics are supported by the second substrate portion. A plurality of first electrical traces are supported by the first substrate portion and electrically connected to the display conductors. A plurality of second electrical traces are supported by the second substrate portion and electrically connected to the drive electronics. An electrical zipper interconnect includes a first row of electrically conductive teeth connected to the first substrate portion and in electrical contact with the first traces and a second row of electrically conductive teeth connected to the second substrate portion and in electrical contact with the second traces. A slider is adapted to be movable so as to interconnect the first and second rows of teeth and to interconnect the first and second traces thereby electrically connecting the display and drive electronics.

With reference to specific aspects of the first embodiment, the flexible substrate includes a third portion. Second drive electronics are supported by the third substrate portion. A plurality of third electrical traces are supported by the first substrate portion and electrically connected to the display conductors and a plurality of fourth electrical traces are supported by the third substrate portion and electrically connected to the second drive electronics. A second electrical zipper interconnect includes a third row of electrically conductive teeth connected to the first substrate portion in electrical contact with the plurality of third traces and a fourth row of electrically conductive teeth connected to the third substrate portion and in electrical contact with the plurality of fourth traces. A second slider is adapted to be movable so as to interconnect the third and fourth rows of teeth and to interconnect the third and fourth traces thereby electrically connecting the display and second drive electronics.

The display device with zipper interconnect includes active matrix, direct drive or passive matrix cholesteric liquid crystal displays. In the active matrix device, the display conductors include a plurality of transistors disposed on one side of the liquid crystal material and a common electrode disposed on the other side. The drive electronics supported on the second substrate portion ("first drive electronics") are adapted to electrically address transistor sources, while the second drive electronics supported by the third substrate portion are adapted to electrically address transistor gates. One of the first and second drive electronics is adapted to electrically address a common electrode.

In the passive matrix display, the display conductors include row electrodes and column electrodes extending orthogonally to each other. Liquid crystal material is disposed between the row and column electrodes. The drive electronics on the first substrate portion are adapted to drive the row electrodes and the second drive electronics are adapted to drive the column electrodes.

In the direct drive display, the display conductors are formed as a plurality of display segments on one side of the liquid crystal material having geometric shapes and conductive material disposed on another side of said liquid crystal material. The drive electronics are adapted to apply an electric field between the conductive material and the display segments effective to form the images on the display.

A second embodiment of the invention features a flexible cholesteric display device with zipper interconnect. The liquid crystal display includes electrode rows and columns arranged orthogonal to each other and a layer of cholesteric liquid crystal material disposed between them. Drive electronics are adapted to selectively electrically address the liquid crystal material effective to produce images on the display. The drive electronics comprise row drive electronics adapted to electrically address the electrode rows and column drive electronics adapted to electrically address the electrode columns. A flexible substrate is selected from the group consisting of a textile fabricated from natural or synthetic fibers, a sheet of polymeric material, paper, flexible metal or glass and combinations thereof. The flexible substrate includes a first substrate portion, a second substrate portion and a third substrate portion. The display is supported by the first substrate portion, the row drive electronics are supported by the second substrate portion and the column drive electronics are supported by the third substrate portion. A plurality of first electrical traces are supported by the first substrate portion and electrically connected to the electrode rows. A plurality of second electrical traces are supported by the second substrate portion and electrically connected to the row drive electronics. A plurality of third electrical traces are supported by the first substrate portion and electrically connected to the electrode columns. A plurality of fourth electrical traces are supported by the third substrate portion and electrically connected to column drive electronics. A first electrical zipper interconnect includes a first row of electrically conductive teeth connected to the first substrate portion and in electrical contact with the first traces and a second row of electrically conductive teeth connected to the second substrate portion and in electrical contact with the second traces. A slider is adapted to be movable so as to interconnect the teeth of the first and second rows and to interconnect the first and second traces thereby electrically connecting the row electrodes of the display and row drive electronics. A second electrical zipper interconnect includes a third row of electrically conductive teeth connected to the first substrate portion and in electrical contact with the third traces and a fourth row of electrically conductive teeth connected to the third substrate portion and in electrical contact with the fourth traces. A slider is adapted to be movable so as to interconnect the teeth of the third and fourth rows and to interconnect the third and fourth traces thereby electrically connecting the column electrodes of the display and the column drive electronics.

Referring to specific features of the present invention the cholesteric liquid crystal material comprises planar and focal conic textures that are stable in an absence of an electric field. A dispersion layer includes the cholesteric liquid crystal material dispersed in a polymer matrix. The dispersion layer can be supported on the flexible substrate without an additional substrate being disposed between the flexible substrate and the dispersion layer. The display has a drapability coefficient between 5 and 95%. Electrically insulative teeth alternate with the conductive teeth of the first, second, third and fourth rows. The column and row electrodes are comprised of conducting polymer or carbon nanotubes coated or printed over the flexible substrate.

The cholesteric material in the dispersion layer is preferably in the form of a droplet dispersion encapsulated in a polymer so that it may be coated or printed over the substrate as described, for example, in the published book, J. W. Doane and A. Khan, *Flexible Flat Panel Displays* (Ed. G. Crawford) John Wiley and Sons, England, Chapter 17 (2005). The droplet dispersions may be prepared by phase separation processes or emulsion processes such as described in U.S. patent application Ser. Nos. 11/046,487 and 11/006,100, which are incorporated herein by reference in their entireties. In phase separation processes, the droplets are created after the material is coated on the substrate by ultraviolet radiation whereas; in the emulsion process the droplets are created before coating. In the case of emulsions, the material is coated and dried to form the layer.

A third embodiment of the invention features a display device that includes the drive electronics as part of the display on the same substrate. The electronic device therefore can now include the control circuitry, which provides the input data adapted to electrically address the display drivers effective to produce the images on the display. The advantage of such a device is that there can be fewer connections to be made by the zipper known to those skilled the art. Electrical power to the drivers is also connected via the zipper. The display can be a reflective display, preferably a bistable display such as an electrophoretic, electrochromic or a liquid crystal display in which the liquid crystal is cholesteric liquid crystal material having planar and focal conic textures that are stable in absence of an electric field. On the other hand, rather than a reflective display, the display device can be an emissive type comprising light emitting elements. A fabric, plastic, metallic or glass substrate can support the display. The display can be a passive matrix display comprised of orthogonal lines of row electrodes and column electrodes each directly and permanently connected to their respective drivers mounted as part of the display common to the display substrate. In this embodiment, the zipper provides the electrical connection between the drivers of the display and the control circuitry that provides the data to the drivers. The display can also be an active matrix display comprised of a matrix of transistors and electrodes disposed on opposing sides of the liquid crystal material in which the elements of the transistor are directly and permanently connected to the gate and source drivers with the zipper providing the electrical connections between the drivers and the control circuitry as well as providing power to the drivers. The display can be a direct driven display comprising electrodes including conductors patterned in geometric shapes and a common electrode disposed on opposing sides of the liquid crystal material; these electrodes directly and permanently connected to drivers with the electrical connections being made via the zipper to the controller circuitry. The zipper also provides connections to power sources to power the drivers.

A fourth embodiment of the invention features a display device that includes the drive electronics and controller circuitry as part of the display. In this embodiment, the display electrodes are each directly and permanently connected to their respective drivers and the drivers are directly and permanently connected to control circuitry mounted as part of the display, all being common to the display substrate. The zipper makes the electrical connection between the display device and electronic circuitry that provides data signals to the controller on the display device. Electrical power to the drivers and controller also is connected via the zipper.

Advantages of the zipper interconnect of the present invention includes extreme ease of use, very fast connection and disconnection times and robust mechanical and electrical connection of the two substrates without compromising the flexibility of either.

Many additional features, advantages and a fuller understanding of the invention will be had from the accompanying drawings and the detailed description that follows. It should be understood that the above Disclosure of the Invention describes the invention in broad terms while the following Detailed Description describes the invention more narrowly and presents embodiments that should not be construed as necessary limitations of the broad invention as defined in the claims.

DETAILED DESCRIPTION

Figure 1:
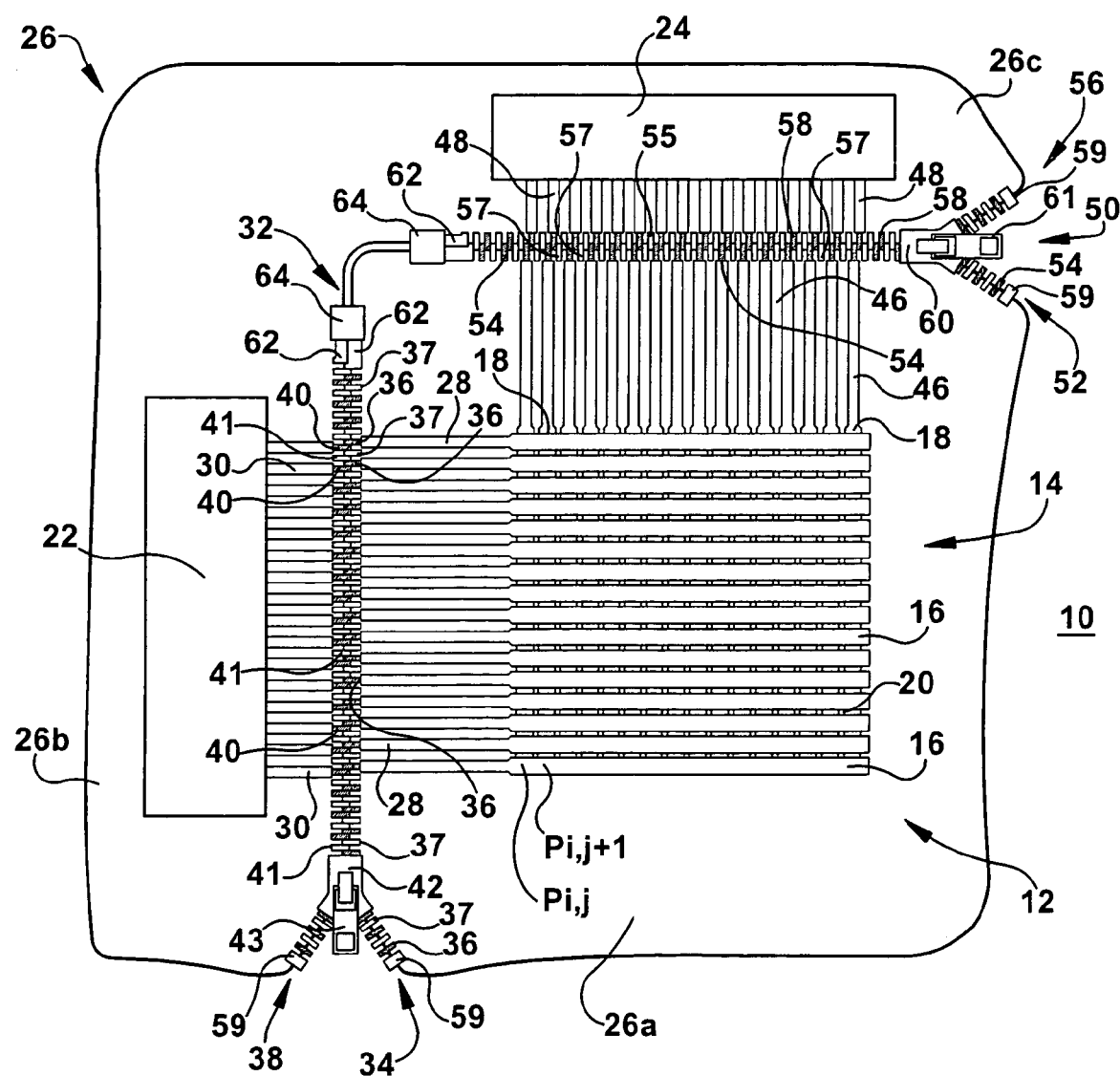
FIG. 1 is a view of a flexible display device with zipper interconnect, wherein the display is a passive matrix cholesteric liquid crystal display.

Referring now to the drawings, the inventive flexible display device 10 with zipper interconnect shown in FIG. 1 includes a passive matrix liquid crystal display 12. A plurality of electrical display conductors 14 include a plurality of row electrodes 16 and a plurality of column electrodes 18 that are arranged orthogonal to each other. A layer of liquid crystal material 20 is disposed between the column electrodes and row electrodes. A plurality of light modulating picture elements ("pixels") of the display are formed at intersections of the column and row electrodes (e.g., $P_{i,j}$, $P_{i,j+1}$, where i represents a row coordinate and j represents a column coordinate). Drive electronics are adapted to selectively electrically address the pixels along the display conductors effective to produce images on the display and include row drive electronics 22 and column drive electronics 24. The display includes other electrical components known to those skilled in the art, including a controller as disclosed in U.S. Pat. Nos. 5,644,330 or 5,625,477, which are incorporated herein by reference in their entireties.

A flexible substrate 26 is selected from the group consisting of a textile fabricated from natural or synthetic fibers, a sheet of polymeric material, paper, flexible metal or glass or combinations thereof. The flexible substrate includes a first substrate portion 26a and a second substrate portion 26b. The display is supported by the first substrate portion 26a and the row drive electronics are supported by the second substrate portion 26b. A plurality of first electrical traces 28 are supported by the first substrate portion and electrically connected to the row electrodes 16. A plurality of second electrical traces 30 are supported by the second substrate portion and electrically connected to the row drive electronics. An electrical zipper interconnect 32 includes a first row 34 of electrically conductive teeth 36 connected to the first substrate portion and in electrical contact with the first traces and a second row 38 of electrically conductive teeth 40 connected to the second substrate portion 26b and in electrical contact with the second traces 30. A slider 42 is adapted to be movable with pull tab 43 connected thereto so as to interconnect the first teeth 36 and second teeth 40 and to interconnect the first and second traces effective to form an electrical connection between the electrode rows 16 of the display and the row drive electronics 22.

The flexible substrate also includes a third substrate portion 26c. The column drive electronics 24 are supported by the third substrate portion. A plurality of third electrical traces 46 are supported by the first substrate portion and electrically connected to the column electrodes 18 and a plurality of fourth electrical traces 48 are supported by the third substrate portion 26c and electrically connected to the column drive electronics 24. A second electrical zipper interconnect 50 includes a third row 52 of electrically conductive teeth 54 connected to the first substrate portion 26a and in electrical contact with the plurality of third traces 46 and a fourth row 56 of electrically conductive teeth 58 connected to the third substrate portion 26c and in electrical contact with the plurality of fourth traces 48.

Electrically insulative teeth (37, 41: first and second rows, respectively; and 55, 59: third and fourth rows respectively) alternate with the conductive teeth in each of the rows of teeth such that when the teeth of opposing rows are engaged, an insulator tooth from one row (e.g., 41) engages an insulator tooth from the opposing row (37) and a conductor tooth from one row (e.g., 40) engages a conductor tooth from the opposing row (36); the pair of engaged insulator teeth 41, 37 is disposed between adjacent pairs of conductive teeth 40, 36 (FIG. 1).

A second slider 60 has a tab 61 enabling it to be movable so as to interconnect the third and fourth rows of teeth 52, 56 and to interconnect the third and fourth traces effective to form an electrical connection between the column electrodes 18 of the display and the column drive electronics 24. It will be apparent to those skilled in the art that the position of the column electrodes and column drive electronics can be reversed relative to the position of the row electrodes and row drive electronics. In addition, rather than a row driver and column driver, a multiconfigurable driver may be electrically connected to the display using the zipper interconnect, as disclosed in U.S. Ser. No. 10/782,461, incorporated by reference.

In all aspects of the invention, the substrate may include one, two or more components. For example, the second and third substrate portions 26b, 26c could be one substrate or integrally formed substrate components.

Other structural zipper components can be included such as stop members 59, insertion pins 62 and retainer boxes 64 known in the construction of mechanical zippers.

Figure 2:
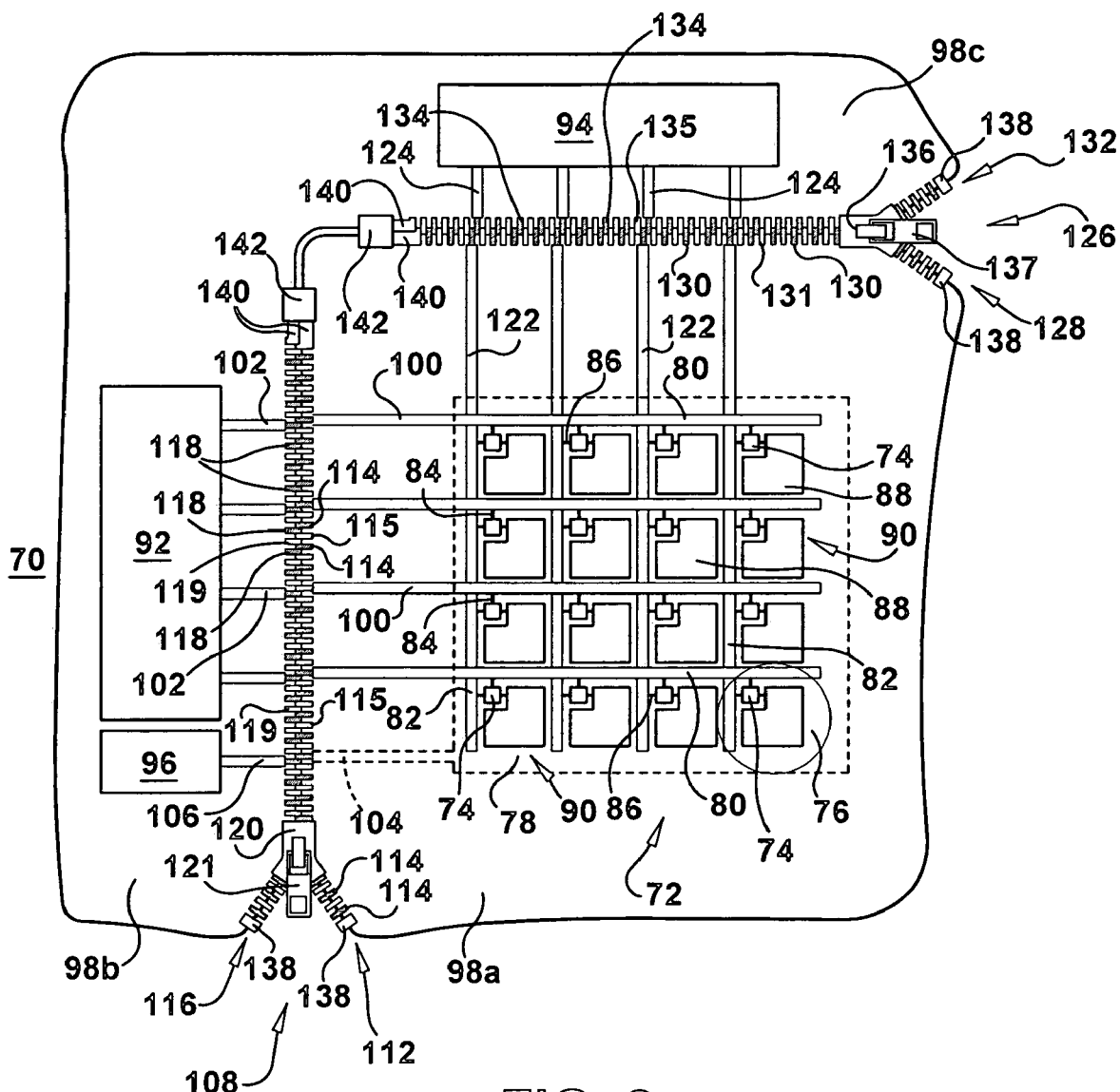
FIG. 2 is a view of a flexible display device with zipper interconnect, wherein the display is an active matrix cholesteric liquid crystal display.

Referring to FIG. 2, another embodiment of the inventive flexible display device 70 with zipper interconnect includes an active matrix liquid crystal display 72. The display includes a plurality of pixel electronics 74 located at a plurality of light modulating picture elements or active matrix pixels 76. Each of the pixel electronics 74 can include one or more transistors, diodes, storage capacitors and suitable circuitry therefor as described in *Liquid Crystals, Applications and Uses*, Chapter 15, Vol. 1, Copyright 1990 by World Scientific Publishing, Edited by Birendra Bahadur, which is incorporated herein by reference in its entirety. The display conductors include a transparent common electrode 78 disposed at an upper plane. At a lower plane, the pixel electronics 74 are disposed, along with gate electrodes 80 and source electrodes 82 that are electrically connected to transistor gates 84 and transistor sources 86, respectively, in a well-known manner. In addition, in electrical connection with the pixel electronics are a plurality of conductor elements 88.

Liquid crystal material 90 (e.g., cholesteric liquid crystal material) is disposed between the upper and lower planes. Each pixel electronics unit 74, associated gate and source electrodes, and corresponding conductor element 88, along with the common electrode 78 and liquid crystal material 90, together form an active matrix pixel 76. Drive electronics are adapted to electrically address the pixels along the display conductors effective to produce images on the display and include gate 92, source 94 and common electrode 96, drive electronics. The display includes other electrical components and circuitry known in the art as disclosed in the Liquid Crystals book above.

A flexible substrate 98 is selected from the group consisting of a textile fabricated from natural or synthetic fibers, a sheet of polymeric material, paper, flexible metal or glass or combinations thereof. The flexible substrate includes a first substrate portion 98a and a second substrate portion 98b. The display is supported by the first substrate portion 98a and the gate and common electrode drive electronics are supported by the second substrate portion 98b. A plurality of first electrical traces 100 are supported by the first substrate pnrftion and electrically connected to (or an integral part of) the gate electrodes 80. A plurality of second electrical traces 102 are supported by the second substrate portion and electrically connected to the gate drive electronics 92. A first electrical trace 104 is supported by the first substrate and in electrical connection with the common electrode 78. A second electrical trace 106 is supported by the second substrate and in electrical connection with the common electrode electronics 96. An electrical zipper interconnect 108 includes a first row 112 of first electrically conductive teeth 114 connected to the first substrate portion and in electrical contact with the first traces 100 and 104 and a second row 116 of second electrically conductive teeth 118 connected to the second substrate portion and in electrical contact with the second traces 102 and 106. A slider 120 has a pull tab 121 enabling it to be movable so as to interconnect the first and second rows of teeth 112, 116 and to interconnect the first and second traces effective to form an electrical connection between the transistor gates 84 of the display and the gate drive electronics 92 and between the common electrode 78 and the common electrode electronics 96.

The flexible substrate also includes a third portion 98c on which the source drive electronics 94 are supported. A plurality of third electrical traces 122 are supported by the first substrate portion 98a and electrically connected to (or an integral part of) source electrodes 82 and a plurality of fourth electrical traces 124 are supported by the third substrate portion 98c and electrically connected to the source drive electronics 94. A second electrical zipper interconnect 126 includes a third row 128 of third electrically conductive teeth 130 connected to the first substrate portion 98a and in electrical contact with the third traces 122 and a fourth row 132 of fourth electrically conductive teeth 134 connected to the third substrate portion and in electrical contact with the fourth traces 124. A slider 136 includes a tab 137 that enables it to be movable so as to interconnect the third and fourth rows of teeth 128, 132 and to interconnect the third and fourth traces effective to form an electrical connection between the transistor sources 86 of the display and the source drive electronics 94.

Electrically insulative teeth (115, 119: first and second rows, respectively; and 131, 135: third and fourth rows, respectively) alternate with the conductive teeth in each of the rows of teeth. When the teeth of opposing rows are engaged, an insulator tooth from one row (e.g., 115) engages an insulator tooth from the opposing row (119) and a conductor tooth from one row (e.g., 114) engages a conductor tooth from the opposing row (118); the pair of engaged insulator teeth (e.g., 115,119) is disposed between adjacent pairs of conductive teeth (114, 118) (FIG. 2).

Other structural zipper components can be included such as stop members 138, insertion pins 140 and retainer boxes 142 known in the construction of mechanical zippers.

Figure 3:
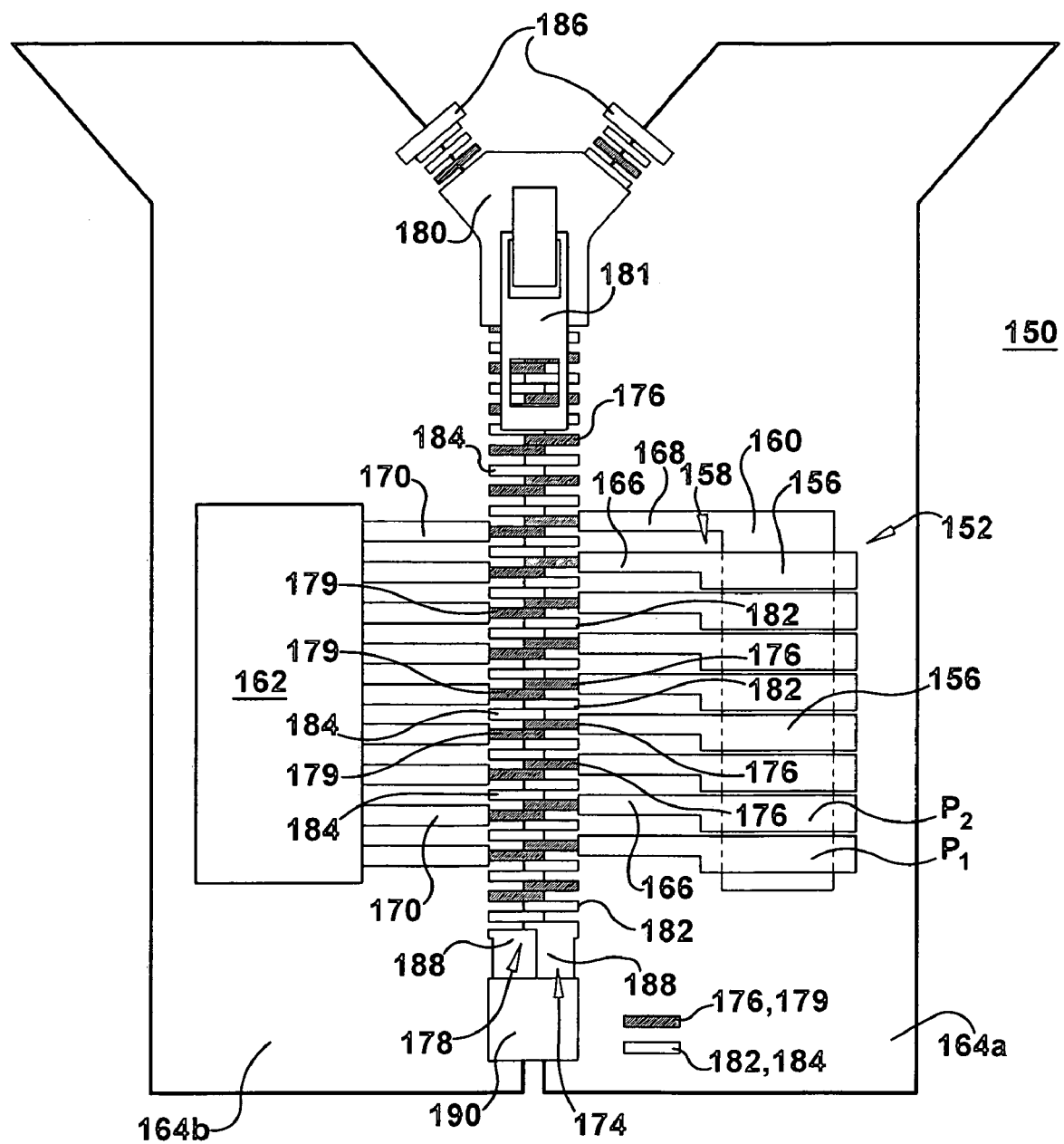
FIG. 3 is a view of a flexible display device with zipper interconnect, wherein the display is direct drive cholesteric liquid crystal display.

Referring to FIG. 3, the inventive flexible display device 150 with zipper interconnect includes a direct drive liquid crystal display 152. A plurality of electrical display conductors are located at a plurality of light modulating picture elements or pixels P1, P2, etc. The display conductors are formed as a plurality of display conductor segments 156 on one side of liquid crystal material (e.g., bottom plane) 158, the segments 156 having particular geometric shapes, and a (e.g., transparent) common electrode 160 disposed on the other side of said liquid crystal material (e.g., top plane). Drive electronics 162 are adapted to apply an electric field between the display segments and the common electrode effective to form the images at the pixels of the display.

A flexible substrate 164 is selected from the group consisting of a textile fabricated from natural or synthetic fibers, a sheet of polymeric material, paper, flexible metal or glass or combinations thereof. The flexible substrate includes a first substrate portion 164a and a second substrate portion 164b. The display 152 is supported by the first substrate portion 164a and the drive electronics 162 are supported by the second substrate portion 164b. A plurality of first electrical, traces 166 are supported by the first substrate portion and electrically connected to the conductor segments 156. A first electrical trace 168 is supported by the first substrate in electrical connection with the common electrode 160. A plurality of second electrical traces 170 are supported by the second substrate portion and electrically connected to the drive electronics 162. An electrical zipper interconnect 172 includes a first row 174 of first electrically conductive teeth 176 connected to the first substrate portion 164a and in electrical contact with the first traces 166 and a second row 178 of second electrically conductive teeth 179 connected to the second substrate portion 164b and in electrical contact with the second traces 170. A slider 180 includes a tab 181 that enables it to be movable so as to interconnect the first and second 174, 178 rows of teeth and to interconnect the first and second traces effective to form an electrical connection between the drive electronics 162 and the display conductive segments 156 and common electrode 160.

Electrically insulative teeth (182, 184: first and second rows, respectively) alternate with the conductive teeth in each of the rows of teeth such that when the teeth of opposing rows are engaged, an insulator tooth 182 from one row engages an insulator tooth from the opposing row 184 and a conductor tooth 176 from one row engages a conductor tooth 179 from the opposing row; the pair of engaged insulator teeth 182, 184 is disposed between adjacent pairs of conductive teeth 176, 179 (FIG. 3).

Other structural zipper components can be included such as stop members 186, insertion pins 188 and a retainer box 190 known in the construction of mechanical zippers.

Conventional driving schemes for bistable passive matrix displays are disclosed in U.S. Pat. Nos. 5,644,330 and 5,625, 477, which are incorporated herein by reference in their entireties. The liquid crystal display device of the present invention may employ multi-configuration drive electronics and other components as disclosed in U.S. patent application Ser. No. 10/782,461, entitled "Multi-Configuration Display Driver," filed Feb. 19, 2004, which is incorporated herein by reference in its entirety. Other types of driving voltage schemes can be applied to the rows and columns such as the dynamic drive scheme (U.S. Pat. No. 5,748,277) or the cumulative drive scheme (U.S. Pat. No. 6,133,895), which are incorporated herein by reference in their entireties. Direct drive displays suitable for use in the present invention are disclosed in U.S. Pat. No. 5,636,044 "Segmented Polymer Stabilized and Polymer Free Cholesteric Texture Display" and active matrix displays suitable for use in the present invention are disclosed in U.S. Pat. No. 6,819,310 "Active Matrix Addressed Bistable Reflective Cholesteric Displays," both of which are incorporated herein by reference in their entireties.

Figure 4:
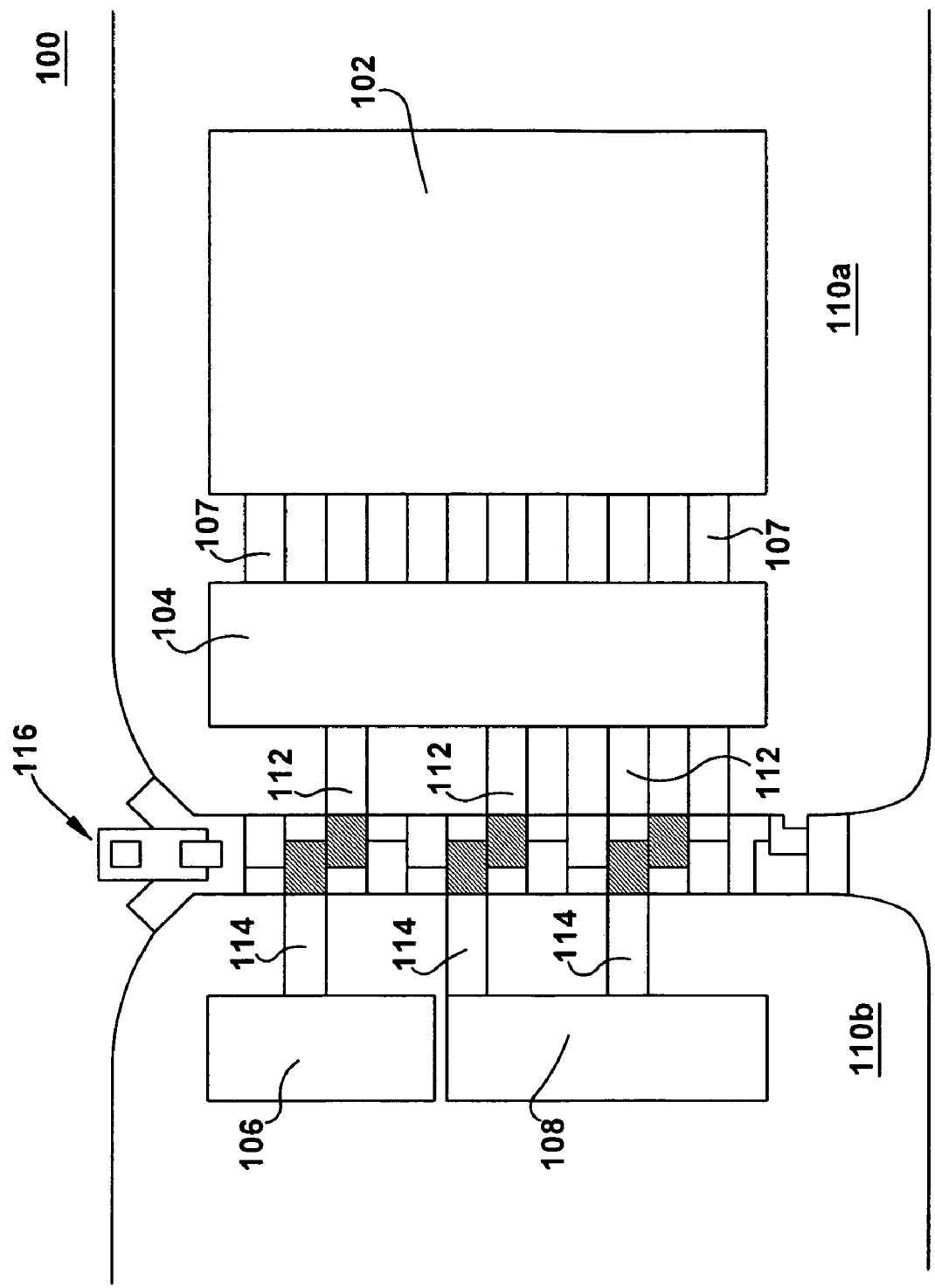
FIG. 4 is a block diagram of a flexible display device with zipper interconnect, wherein a display and drive electronics are disposed on one substrate portion and a controller and power source are disposed on another substrate portion.

FIG. 4 features an inventive flexible display device 100 with zipper interconnect including a liquid crystal display 102. The liquid crystal display can be a passive matrix, active matrix or direct drive cholesteric liquid crystal display or other display known in the art as described above. The display includes any of the electrical display conductors described above. For example, a passive matrix display includes row and column electrodes. An active matrix display includes pixel electronics units, associated conductor elements, common electrode and gate and source electrodes as described above. A direct drive display includes conductor segments having particular geometric shapes and common electrode disposed on the other side of said liquid crystal material. A layer of any of the aforementioned types of liquid crystal material is disposed between the opposing display conductors. Drive electronics 104 are adapted to selectively electrically address pixels of the display along the display conductors effective to produce images on the display. Any of the aforementioned drive electronics described above may be used. The passive matrix display includes row and column drivers. The active matrix display includes drive electronics for transistor gate, transistor source and common electrode. The direct drive display includes drive electronics adapted to apply an electric field between the display segments and the common electrode. The display device includes other electrical components known to those skilled in the art, including power source 106, controller 108 including control circuitry adapted to provide input data to the drive electronics that enables the drive electronics to apply the electric field and electronic circuitry adapted to provide data signals to the controller. The drive electronics and display electrodes are permanently electrically interconnected in a known manner as by connectors 107.

A flexible substrate 110 is selected from the group consisting of a textile fabricated from natural or synthetic fibers, a sheet of polymeric material, paper, flexible metal or glass, and combinations thereof. The flexible substrate includes a first substrate portion 110a and a second substrate portion 110b. The display 102 and drive electronics 104 are supported by the first substrate portion and the controller 108 and power source 106 are supported by the second substrate portion. A plurality of first electrical conductors 112 (e.g., traces) are connected to the drive electronics and supported on the first substrate portion 110a and a plurality of second electrical conductors 114 (e.g., traces) are connected to the controller 108 and supported on the second substrate portion 10b. The power source 106 is electrically connected to at least one of the second conductors 114. It will be appreciated that the number and location of electrical conductors and permanent electrical connections are shown for ease of understanding and may vary from what is shown in FIG. 4.

A zipper interconnect 116 is adapted to enable electrical connection between the first electrical conductors 112 and the second electrical conductors 114 thereby electronically connecting the controller 108 with the drive electronics 104. The zipper interconnect is also adapted to interconnect the first conductors and the second conductors effective to enable power to be transmitted from the power source 106 to the drive electronics 104.

The zipper interconnect can include electrically insulative teeth or portions of teeth alternating with the conductive teeth in each of the rows of teeth as described above. Other structural zipper components can be included such as stop members, insertion pins and retainer boxes known in the construction of mechanical zippers.

Figure 5:
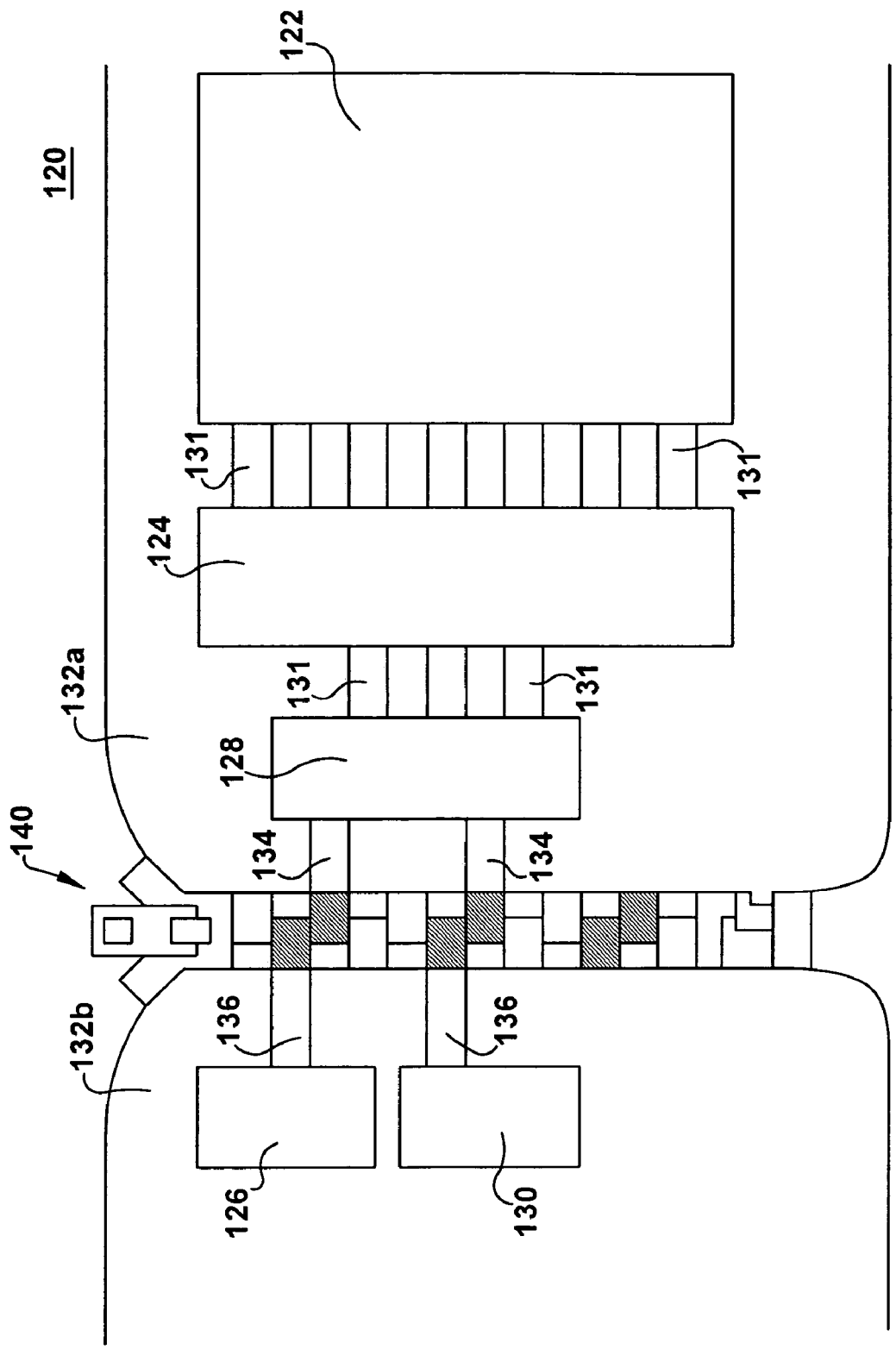
FIG. 5 is a block diagram of a flexible display device with zipper interconnect, wherein a display, drive electronics and controller are disposed on one substrate portion and a power source and electronic circuitry for providing data signals to the controller, are provided on another substrate portion.

FIG. 5 features an inventive flexible display device 120 with zipper interconnect including a liquid crystal display 122. The liquid crystal display can be a passive matrix, active matrix or direct drive cholesteric liquid crystal display or other display known in the art as described above. The display includes any of the electrical display conductors described above. For example, a passive matrix display includes row and column electrodes. An active matrix display includes pixel electronics units, associated conductor elements, common electrode and gate and source electrodes as described above. A direct drive display includes conductor segments having particular geometric shapes and common. A layer of any of the aforementioned types of liquid crystal material is disposed between the opposing display conductors. Drive electronics 124 are adapted to selectively electrically address pixels of the display along the display conductors effective to produce images on the display. Any of the aforementioned drive electronics described above may be used. The passive matrix display includes row and column drivers. The active matrix display includes drive electronics for transistor gate, transistor source and common electrode. The direct drive display includes drive electronics adapted to apply an electric field between the display segments and the common electrode. The display includes other electrical components known to those skilled in the art, including power source 126, controller 128 including control circuitry adapted to provide input data to the drive electronics that enables the drive electronics to apply the electric field and electronic circuitry 130 adapted to provide data signals to the controller 128. The display electrodes, drive electronics and controller are permanently electrically interconnected in a known manner as at 131.

A flexible substrate 132 is selected from the group consisting of a textile fabricated from natural or synthetic fibers, a sheet of polymeric material, paper, flexible metal or glass, and combinations thereof. The flexible substrate includes a first substrate portion 132a and a second substrate portion 132b. The display 122, drive electronics 124 and controller 128 are supported by the first substrate portion 132a; and the power source 126 and electronic data circuitry 130 are supported by the second substrate portion 132b. A plurality of first electrical conductors 134 (e.g., traces) are connected to the controller 128 and supported by the first substrate portion 132a and a plurality of second electrical conductors 136 (e.g., traces) are connected to the power source 126 and to the data circuitry 130 and supported on the second substrate portion 132b. It will be appreciated that the number and location of electrical conductors and permanent electrical connections are shown for ease of understanding and may vary from what is shown in FIG. 5.

A zipper interconnect 140 is adapted to enable electrical connection between the first electrical conductors 134 and the second electrical conductors 136 thereby electronically connecting the controller 128 with the data circuitry 130 adapted to provide data signals to the controller. The zipper interconnect is also adapted to interconnect the first conductors and the second conductors effective to enable power to be transmitted from the power source 126 to the controller 128.

The zipper interconnect can include electrically insulative teeth or portions of teeth alternating with the conductive teeth in each of the rows of teeth as described above. Other structural zipper components can be included such as stop members, insertion pins and retainer boxes known in the construction of mechanical zippers.

As a first variation of FIG. 4, a passive matrix liquid crystal display, row and column drivers are supported by a first substrate portion and permanently electrically interconnected, a power source is supported on a second substrate portion, a power source is supported on a third substrate portion and a controller is supported on a fourth substrate portion. A first zipper interconnect electrically connects the power source on the second substrate portion with the row driver on the first substrate portion and interconnects the controller with the row driver on the first substrate portion. A second zipper interconnect electrically connects the power source on the third substrate portion with the column driver on the first substrate portion and interconnects the controller with the column driver on the first substrate portion. The first, second, third and fourth substrate portions may be separate components (e.g., pieces of fabric) or all on one piece of substrate as in the case where the zipper interconnects are at right angles but spaced from each other and the controller is diagonal from the display near an imaginary line of intersection of the zipper interconnects. The display can be a bistable cholesteric liquid crystal display.

As a second variation of FIG. 4, an active matrix liquid crystal display, gate and source drivers and common electrode electronics drivers are supported by a first substrate portion and permanently electrically interconnected, a power source is supported on a second substrate portion, a power source is supported on a third substrate portion and a controller is supported on a fourth substrate portion. A first zipper interconnect electrically connects the power supply on the second substrate portion with the gate driver on the first substrate portion and interconnects the controller with the gate driver on the first substrate portion. A second zipper interconnect electrically connects the power source on the third substrate portion with the source driver on the first substrate portion and interconnects the controller with the source driver on the first substrate portion. Also interconnected by the first or second zipper interconnect is the controller and electronics for the common electrode. The first, second, third and fourth substrate portions may be separate components (e.g., pieces of fabric) or all on one piece of substrate as in the case where the zipper interconnects are at right angles but spaced from each other and the controller is diagonal from the display near an imaginary line of intersection of the zipper interconnects. The display can be a bistable cholesteric liquid crystal display.

As a first variation of FIG. 5, a passive matrix liquid crystal display, row and column drivers and controller electrically connected to the row and column drivers, are supported by a first substrate portion and permanently electrically interconnected, and a power source and circuitry for providing data signals to the controller are supported on a second substrate portion. A zipper interconnect electrically connects the power supply on the second substrate portion with the controller on the first substrate portion and the data circuitry on the second substrate portion with the controller on the first substrate portion. The display can be a bistable cholesteric liquid crystal display.

As a second variation of FIG. 5, an active matrix liquid crystal display, gate and source drivers, common electrode electronics and controller for the drivers, are supported by a first substrate portion and permanently electrically interconnected. A power source and circuitry for providing data signals to the controller are supported on a second substrate portion. A zipper interconnect electrically connects the power supply and the data circuitry on the second substrate portion with the controller on the first substrate portion. The display can be a bistable cholesteric liquid crystal display.

Many modifications and variations of the invention will be apparent to those of ordinary skill in the art in light of the foregoing disclosure. Therefore, it is to be understood that, within the scope of the appended claims, the invention can be practiced otherwise than has been specifically shown and described.

What is claimed is:

1. A display device comprising an electronic display adapted to produce images, an electronic device that electrically communicates with said display and a zipper interconnect adapted to enable electrical connection between said display and said electronic device.

2. The display device of claim 1 wherein said electronic device includes electronics adapted to electrically address and power said display effective to produce said images.

3. The display device of claim 2 wherein said display is a liquid crystal display.

4. The display device of claim 3 wherein said liquid crystal display comprises cholesteric liquid crystal material having planar and focal conic textures that are stable in absence of an electric field.

5. The display device of claim 2 wherein said display device comprises light emissive elements.

6. The display device of claim 1 comprising a fabric substrate supporting said display.

7. The display device of claim 2 wherein said display is a passive matrix display comprised of orthogonal lines of row electrodes and column electrodes and said electrical connection is made to said lines of row electrodes and column electrodes.

8. The display device of claim 2 wherein said display is an active matrix display comprised of a matrix of transistors and electrodes disposed on opposing sides of said display, said electrical connections being made to said transistors and said electrodes.

9. The display device of claim 2 wherein said display is a direct driven display comprising conductors patterned in geometric shapes and a common electrode, said conductors and said common electrode being disposed on opposing sides of said display, said electrical connections being made to said conductors and said common electrode.

10. The display device of claim 1 comprising an additional display electrically connected to said display with said zipper interconnect.

11. A display device comprising:
a flexible substrate including a first substrate portion and a second substrate portion;
an electronic display including a plurality of display conductors, said display being supported by said first substrate portion;
drive electronics for applying an electric field along said display conductors effective to produce an image on said display, said drive electronics being permanently electrically connected to said display conductors and being supported on said first substrate portion;
a controller including control circuitry adapted to provide input data to said drive electronics that enables said drive electronics to apply said electric field, said controller being supported by said second substrate portion;
a plurality of first electrical conductors connected to said drive electronics and supported on said first substrate portion and a plurality of second electrical conductors connected to said controller and supported on said second substrate portion; and
a zipper interconnect adapted to enable electrical connection between said first electrical conductors and said second electrical conductors thereby electronically connecting said controller with said drive electronics.

12. The display device of claim 11 comprising a power source electrically connected to at least one of said second conductors, wherein said zipper interconnect is adapted to interconnect said first conductors and said second conductors effective to enable power to be transmitted from said power source to said drive electronics.

13. The display device of claim 11 wherein said display is a bistable display selected from the group consisting of an electrophoretic display, an electrochromic display, and a liquid crystal display including cholesteric liquid crystal material having planar and focal conic textures that are stable in absence of an electric field.

14. The display device of claim 11 wherein said display is an emissive type display comprising light emitting elements.

15. The display device of claim 11 wherein said display is a passive matrix display comprised of orthogonal lines of row electrodes and column electrodes and said electrical connection is made to said lines of row electrodes and column electrodes.

16. The display device of claim 11 wherein said display is an active matrix display comprised of a matrix of transistors and electrodes disposed on opposing sides of said liquid crystal material, said electrical connections being made to said transistors and said electrodes.

17. The display device of claim 11 wherein said display is a direct driven display comprising conductors patterned in geometric shapes and a common electrode, and comprising a layer of liquid crystal material, said conductors and said common electrode being disposed on opposing sides of said liquid crystal layer, said electrical connections being made to said conductors and said common electrode.

18. The display device of claim 11 wherein said substrate is comprised of a material selected from the group consisting of fabric, plastic, metal, glass and combinations thereof.

19. A display device comprising:
a flexible substrate including a first substrate portion and a second substrate portion;
an electronic display including a plurality of display conductors, said display being supported by said first substrate portion;
drive electronics for applying an electric field along said display conductors effective to produce an image on said display, said drive electronics being permanently electrically connected to said display conductors and supported on said first substrate portion;
a controller including control circuitry adapted to provide input data to said drive electronics that enables said drive electronics to apply said electric field, said controller being permanently electrically connected to said drive electronics and supported by said first substrate portion;
electronic circuitry adapted to provide data signals to said controller, said electronic circuitry being supported by said second substrate portion;
a plurality of first electrical conductors connected to said controller and supported on said first substrate portion and a plurality of second electrical conductors connected to said electronic circuitry and supported on said second substrate portion; and a zipper interconnect adapted to enable electrical connection between said first electrical conductors and said second electrical conductors thereby electronically connecting said electronic circuitry with said drive controller.

20. The display device of claim 19 comprising a power source electrically connected to at least one of said second conductors, wherein said zipper interconnect is adapted to interconnect said first conductors and said second conductors effective to enable power to be transmitted from said power source to said drive electronics and said controller.

21. The display device of claim 19 wherein said display is a bistable display selected from the group consisting of an electrophoretic display, an electrochromic display, and a liquid crystal display including cholesteric liquid crystal material having planar and focal conic textures that are stable in absence of an electric field.

22. The display device of claim 19 wherein said display is an emissive type display comprising light emitting elements.

23. The display device of claim 19 wherein said display is a passive matrix liquid crystal display comprised of orthogonal lines of row electrodes and column electrodes.

24. The display device of claim 19 wherein said display is an active matrix liquid crystal display comprised of a matrix of transistors and electrodes disposed on opposing sides of said liquid crystal material.

25. The display device of claim 19 wherein said display is a direct driven liquid crystal display comprising conductors patterned in geometric shapes and a common electrode.

26. The display device of claim 19 wherein said substrate is comprised of a material selected from the group consisting of fabric, plastic, metal, glass and combinations thereof.

27. A flexible display device with zipper interconnect comprising:
- a display including a plurality of electrical display conductors;
- drive electronics adapted to selectively electrically address said display along said display conductors effective to produce images on said display;
- a flexible substrate selected from the group consisting of a textile fabricated from natural or synthetic fibers, a sheet of polymeric material, paper, metal, glass and combinations thereof, said flexible substrate including a first substrate portion and a second substrate portion, said display being supported by said first substrate portion and said drive electronics being supported by said second substrate portion;
- a plurality of first electrical traces supported by said first substrate portion and electrically connected to said display conductors;
- a plurality of second electrical traces supported by said second substrate portion and electrically connected to said drive electronics; and
- an electrical zipper interconnect, comprising
  - a first row of electrically conductive teeth connected to said first substrate portion and in electrical contact with said first traces and a second row of electrically conductive teeth connected to said second substrate portion and in electrical contact with said second traces, and
  - a slider adapted to be movable so as to interconnect the teeth of said first row and the teeth of said second row and to interconnect said first traces and said second traces thereby electronically connecting said drive electronics and said display.

28. The display device of claim 27 wherein said first substrate portion has a different chemical composition than said second substrate portion.

29. The display device of claim 27 comprising electrically insulative teeth alternating with the teeth of said first row and the teeth of said second row.

30. The display device of claim 27 wherein said flexible substrate comprises a third portion, further comprising second said drive electronics supported by said third substrate portion, a plurality of third electrical traces being supported by said first substrate portion and electrically connected to said display conductors and a plurality of fourth electrical traces supported by said third substrate portion and electrically connected to said second drive electronics; and
- a second electrical zipper interconnect comprising
  - a third row of electrically conductive teeth connected to said first substrate portion and in electrical contact with said third traces and a fourth row of electrically conductive teeth connected to said third substrate portion and in electrical contact with said fourth traces, and
  - a second slider adapted to be movable so as to interconnect the teeth of said third row and the teeth of said fourth row and to interconnect said third traces and said fourth traces thereby electronically connecting said second drive electronics and said display.

31. The display device of claim 30 wherein said display conductors include row electrodes and column electrodes extending orthogonally to each other and comprising liquid crystal material disposed between said row electrodes and said column electrodes, said drive electronics on said first substrate portion being adapted to drive said row electrodes and said second drive electronics being adapted to drive said column electrodes.

32. The display device of claim 30 comprising liquid crystal material, wherein said display conductors comprise a plurality of transistors having sources and gates on one side of said liquid crystal material and a transparent common electrode on the other side of said liquid crystal material, wherein first said drive electronics on said first substrate portion is adapted to electrically address said transistor sources, said second drive electronics is adapted to electrically address said transistor gates and one of said first drive electronics and said second drive electronics is adapted to electrically address said common electrode, effective to form the images on said display.

33. The display device of claim 27 comprising electrically insulative teeth alternating with the teeth of said first row and the teeth of said second row.

34. The display device of claim 27 wherein said display is a reflective display.

35. The display of claim 34 wherein the reflective display comprises a bistable liquid crystal material selected from the group consisting of cholesteric liquid crystal, twisted nematic liquid crystal, super twisted nematic liquid crystal, ferroelectric material, smectic material and combinations thereof.

36. The display device of claim 27 wherein said display is an emissive display comprising a plurality of light emissive elements.

37. The display device of claim 27 comprising liquid crystal material, said display conductors being formed as a plurality of display segments on one side of said liquid crystal material having geometric shapes, and a transparent common electrode disposed on the other side of said liquid crystal material, wherein said drive electronics are adapted to apply an electric field between said common electrode and said display segments effective to form the images on said display.

38. The liquid crystal display of claim 37 wherein said display segments are adapted to display at least one digit.

39. A flexible cholesteric display device with zipper interconnect comprising:
- a liquid crystal display comprising electrode rows and electrode columns arranged orthogonal to each other, a layer of cholesteric liquid crystal material disposed between said electrode rows and said electrode columns,
- drive electronics adapted to electrically address said liquid crystal material effective to produce images on said display, said drive electronics comprising row drive electronics adapted to electrically address said row electrodes and column drive electronics adapted to electrically address said column electrodes;
- a flexible substrate selected from the group consisting of a textile fabricated from natural or synthetic fibers, a sheet of polymeric material, paper, flexible glass, flexible metal and combinations thereof, said flexible substrate including a first substrate portion, a second substrate portion and a third substrate portion, said display being supported by said first substrate portion, said row drive electronics being supported by said second substrate portion and said column drive electronics being supported by said third substrate portion,
- a plurality of first electrical traces supported by said first substrate portion and electrically connected to said electrode rows;
- a plurality of second electrical traces supported by said second substrate portion and electrically connected to said row drive electronics;
- a plurality of third electrical traces supported by said first substrate portion and electrically connected to said electrode columns;
- a plurality of fourth electrical traces supported by said third substrate portion and electrically connected to said column drive electronics;
- a first electrical zipper interconnect, comprising
  - a first row of electrically conductive teeth connected to said first substrate portion and in electrical contact with said first traces and a second row of electrically conductive teeth connected to said second substrate portion and in electrical contact with said second traces, and
  - a slider adapted to be movable so as to interconnect the teeth of said first row and the teeth of said second row and to interconnect said first traces and said second traces effective to form an electrical connection between said display and said row drive electronics;
- a second electrical zipper interconnect, comprising
  - a third row of electrically conductive teeth connected to said first substrate portion and in electrical contact with said third traces and a fourth row of electrically conductive teeth connected to said third substrate portion and in electrical contact with said fourth traces, and
  - a slider adapted to be movable so as to interconnect the teeth of said third row and the teeth of said fourth row and to interconnect said third traces and said fourth traces effective to form an electrical connection between said display and said column drive electronics.

40. The display device of claim 39 wherein said cholesteric liquid crystal material comprises planar and focal conic textures that are stable in an absence of an electric field.

41. The display device of claim 40 comprising a dispersion layer including said cholesteric liquid crystal material dispersed in a polymer matrix.

42. The display device of claim 41 said dispersion layer being supported on said flexible substrate without an additional substrate being disposed between said flexible substrate and said dispersion layer.

43. The display device of claim 41 wherein said display has a drapability coefficient of 5% to 95%.

44. The display device of claim 39 comprising electrically insulative teeth alternating with the conductive teeth of said first row, the teeth of said second row, the teeth of said third row and the teeth of said fourth row.

45. The display device of claim 39 wherein said column electrodes and said row electrodes are comprised of conducting polymer or carbon nanotubes coated or printed over said flexible substrate.

46. The display device of claim 1 wherein said display is selected from the group consisting of an electrophoretic display, an electrochromic display, and a liquid crystal display including cholesteric liquid crystal material having planar and focal conic textures that are stable in absence of an electric field.

* * * * *